United States Patent [19]
Gamble et al.

[11] Patent Number: 5,399,295
[45] Date of Patent: * Mar. 21, 1995

[54] EMI SHIELDING COMPOSITES

[75] Inventors: Jeffrey Gamble, Midland; Larry D. Yats, Clare, both of Mich.

[73] Assignee: The Dow Chemical Company, Midland, Mich.

[*] Notice: The portion of the term of this patent subsequent to Nov. 27, 2007 has been disclaimed.

[21] Appl. No.: 99,297

[22] Filed: Jul. 29, 1993

Related U.S. Application Data

[63] Continuation of Ser. No. 286,398, Dec. 19, 1988, abandoned, which is a continuation-in-part of Ser. No. 619,437, Jun. 11, 1984, Pat. No. 4,973,514.

[51] Int. Cl.$^6$ ............................ H01B 1/06; B32B 5/06
[52] U.S. Cl. .................................... 252/511; 252/512; 252/518; 428/297; 428/323; 428/408
[58] Field of Search ........................ 252/511, 512, 518; 523/137; 428/195, 196, 197, 242, 244, 297, 323, 408; B32B 5/06; H01B 1/06

[56] References Cited

U.S. PATENT DOCUMENTS

| | | | |
|---|---|---|---|
| 4,435,465 | 3/1984 | Ebneth et al. | 428/195 |
| 4,566,990 | 1/1986 | Liu et al. | 252/512 |
| 4,973,514 | 11/1990 | Gamble et al. | 428/297 |
| 5,004,561 | 4/1991 | Nomura et al. | 252/518 |

FOREIGN PATENT DOCUMENTS

| | | |
|---|---|---|
| 0090432 | 10/1983 | European Pat. Off. . |
| 0103695 | 3/1984 | European Pat. Off. . |

*Primary Examiner*—Mark L. Bell
*Assistant Examiner*—Paul Marcantoni

[57] ABSTRACT

A composite sheet is disclosed comprising a continuous matrix of a synthetic resinous material having randomly dispersed therein conductive fibers and a particulate, conductive or semi-conductive filler. In addition to providing excellent EMI shielding properties, the composite sheets are formable and are of sufficient strength to act as structural components.

13 Claims, No Drawings

EMI SHIELDING COMPOSITES

CROSS-REFERENCE TO RELATED APPLICATIONS

This is a continuation of U.S. application Ser. No. 07/286,398, filed Dec. 19, 1988, now abandoned, which is a continuation-in-part of U.S. application Ser. No. 06/619,437, filed Jun. 11, 1984 now U.S. Pat. No. 4,973,514, filed Jun. 11, 1984.

BACKGROUND OF THE INVENTION

This invention relates to composites of a synthetic resinous material having randomly dispersed therein conductive fibers and a particulate conductive or semiconductive filler material. Such composites are effective, for example, as shields for electro-magnetic interference (EMI) and/or electrostatic dissipation.

Electronic devices, particularly solid state electronic devices such as are found in computers, microprocessors, calculators, watches, radios, televisions, automobile ignition systems, word processors, and the like, are often sensitive to EMI which is present in the environment from many sources. It is most commonly emitted by electrical sources or the electronic devices themselves. Radio, television and other communication systems are also sources of EMI. EMI often disrupts the functioning of said electronic devices, causing diminished performance or even total failure of the device. Although normal performance of the electronic device is usually restored upon elimination of the EMI, the temporary failure of the electronic device may be of critical importance. For example, automobile electronic ignition systems have been known to fail due to EMI emitted from the spark plugs of the automobile's ignition system or even from the operation of the car radio. Such failure causes the entire automobile engine to be temporarily inoperative. Similarly, aircraft electronic guidance systems, communications systems, onboard computers and the like are known to be adversely effected even by the playing of portable radios in the aircraft.

To reduce these problems, it is common practice to "shield" electronic devices from external EMI. Metals are extremely effective shielding materials for EMI. Thus, it is known to protect electronic devices by placing a metal shield between the device and the external EMI source. This metal shield ranges in thickness from a foil to a load-bearing metal sheet.

It is often desirable from a design and economic standpoint to combine the EMI shielding function with structural or other functions. For example, if the EMI shield can be incorporated into other necessary parts of the article containing the electronic device, it is often possible to reduce the overall cost of the article by eliminating a part. While metal shields can often be used to combine functions in this manner, often the use of metal parts has decided disadvantages. Where weight is a factor, metal parts are often too heavy. Furthermore, metals cannot be molded into highly convoluted shapes. When a lightweight or highly complex shaped part is desired, it is therefore preferable to use a plastic material.

It has previously been attempted to provide resinous materials having EMI shielding properties. For example, it has been attempted to coat by painting, vapor deposition, electroless deposition and other techniques, a thin metallic layer onto a synthetic resinous material substrate. While good EMI shielding can be obtained in this manner, the coated surface is often subject to scratches, imperfections, marring, denting, etc., which opens "windows" to EMI. Environmental weathering and surface oxidation also adversely affect the metal layer. In addition, the coated surface often cannot be molded or shaped without destroying the integrity of the coating. Therefore, the synthetic resinous material must usually be pre-shaped in one step and subsequently coated in a separate step.

It has also been attempted to place a conductive material inside a synthetic resinous material part to form an EMI shield. Such conductive composites generally comprise a thermosetting or thermoplastic matrix containing carbon black or metal powders, flakes or fibers as a conductive filler material. While adequate shielding is often obtained with such composites, high loading of the conductive filler material is required to achieve the desired shielding. Moreover, these composites exhibit poor surface characteristics and are not highly formable (i.e., can be formed only at low extension ratios). In addition such composites generally are of high density and exhibit relatively low strength-to-weight ratios. Due to the high content of the filler material in such composites, molding equipment used to process these composites exhibit excessive wear due to the highly abrasive nature of the conductive filler materials.

Recently, metal fibers, metallized glass fibers, graphite and metallized graphite fibers have been proposed for use in composite EMI shielding materials. However, in the bulk molding or injection molding applications in which such composites are employed, breaking of the fibers greatly reduces the efficiency of the shielding. Accordingly, continuous metal or metallized glass fibers are employed to minimize the effect of the breaking, or it is necessary to conduct the molding operation under careful conditions in order to minimize such breaking. In either case, such composites did not provide an inexpensive means for providing an effective EMI shielding material. Moreover, due to the use of long fibers and thermosetting resins, such composites were not readily moldable as are thermoplastic resins. Due to the breakage of fibers in this composite, a content of metal fibers or metallized glass fibers of at least 25 percent by weight of the composite was generally required to provide effective EMI shielding. Since metal fibers and metallized glass fibers do not provide substantial reinforcement to the composite, it is generally necessary to add additional reinforcing fibers to obtain the desired physical properties. The resulting composite is a very dense material having poor moldability.

It is also often possible to provide a resin sheet which is electrically conductive. Such electrically conductive sheets would be capable of dissipating static electricity, thereby making them useful in preventing instantaneous discharge of built-up static electricity. Also, by dissipating static electricity, it is possible to reduce or eliminate electrostatic dust build-up on the sheet. Unfortunately, the presently available conductive resin sheets have the same types of deficiencies described for the EMI shield materials.

It would now be desirable to provide a synthetic resinous material composite sheet which is capable of converting radiation energy to heat and in which the disadvantages of previously known microwave absorbers are minimized or overcome.

It would also be desirable to provide a synthetic resinous material composite sheet which is useful as an EMI shielding material and which is also useful as a sheet that dissipates static electrical charges and/or absorbs microwave energy. Such a sheet should be readily moldable and possess good physical properties.

SUMMARY OF THE INVENTION

The present invention comprises a resinous composite sheet of a continuous matrix of a polymeric resin having randomly dispersed therein from about 0.05 to about 30 percent by weight of the composite of a finely particulate conductive or semi-conductive filler material and from about a 0.25 to about 45 percent by weight of the composite of conductive fiber having an aspect ratio of at least about 25, which fibers are randomly oriented in two dimensions substantially in the plane defined by said sheet. Optionally, said sheet may also contain a semi-conductive filler in the form of a fine particulate. The invention is useful as an EMI shield, a conductive polymer, a microwave absorber, and/or like applications.

A shielding effectiveness of from 20 to 40 decibels is easily obtainable using a relatively low amount of conductive fibers and conductive or semi-conductive filler material. In some preferred applications, higher shieldings of greater than about 80 decibels can be obtained. The effectiveness of the shielding afforded by the composite sheet of the invention is not significantly adversely affected by molding, shaping or otherwise forming the sheet into complex shapes. During such forming process, the dispersed fibers flow with the polymeric continuous phase so that the dispersed fibers are homogeneously distributed throughout the shaped article. Thus, the sheet of this invention is readily formed into complex shaped articles without the need to subsequently coat or otherwise treat the shaped article to impart EMI shielding properties thereto. The presence of the fibers additionally improves the physical properties (i.e., impact strength) of the EMI shield. In addition, the sheet of this invention solves the long-standing problem of the uneven distribution of the conductive fibers or fillers throughout the sheet. With the sheet of this invention, the shielding material is distributed evenly throughout the entire part, even at the edges thereof.

DETAILED DESCRIPTION OF THE INVENTION

The synthetic resinous material used herein can be any thermoplastic or thermosetting resin which is solid at ambient temperatures and into which the particulate filler and conductive fibers can be admixed in accordance with the general procedure described in U.S. Pat. No. 4,426,470.

In the preferred method of preparing the composite sheet, it is generally preferable that the resin be water-insoluble and capable of being prepared as or formed into a fine particulate. In general, it is preferable that the resin used as a starting material herein have an average particle size in the range from 0.1 to 400 µm, preferably from 50 to 200 µm.

Suitable thermoplastic resins include, for example, polyolefins such as polyethylene; ultra high molecular weight polyethylene; high density polyethylene; linear low density polyethylene; polypropylene, and the like; chlorinated polyethylene; polycarbonates; ethylene acrylic acid copolymers; polyamides such as nylon 6, nylon 6,6, and the like; phenylene oxide resins; phenylene sulfide resins; polyoxymethylenes; polyesters; the so-called ABS (acrylonitrile, butadiene, styrene) resins; polyvinyl chloride; vinylidene chloride/vinyl chloride resins; acrylic resins such as polymers and copolymers of alkyl esters of acrylic and methacrylic acid; and vinyl aromatic resins such as polystyrene, poly(vinylnaphthalene), poly(vinyltoluene), and the like.

Thermosetting resins useful herein include epoxy resins, vinyl ester resins, phenol-formaldehyde resins, and the like.

Although any of these resins are suitable herein, the particular choice of resin may depend somewhat on the particular requirements of the application for which the composite sheet is to be used. For example, properties such as impact resistance, tensile strength, heat distortion temperature, barrier characteristics and the like are all affected by the choice of resin. It is generally preferable to use a thermoplastic resin, due to greater ease in preparing and molding the composite sheet. For most applications, polyolefins, vinyl aromatic resins, vinylidene chloride and vinyl chloride copolymers are preferred due to the relatively low cost and generally good properties.

The resin forms a continuous matrix into which the other components are uniformly dispersed. The particulate filler and the conductive fibers are randomly dispersed into said continuous matrix as further described hereinafter.

The conductive fibers employed herein can be of various compositions. Metal fibers, such as aluminum, nickel, copper, iron and steel fibers are useful as the conductive fiber. Of particular interest are stainless steel fibers. Carbonaceous materials such as carbon or graphite fibers are also sufficiently conductive for use herein. Diverse metal-coated fibers are suitable for use herein, including metallized glass, metallized graphite or metallized plastic fibers. Mixtures of the foregoing fibers are, of course, also useful herein. Of particular interest are nickel or silver-coated graphite fibers or mixtures of carbon or graphite fibers with metal-coated fibers.

The conductive fiber employed herein has an aspect ratio (length to diameter) of from 25 to 2,000, preferably from 200 to 1,800.

Advantageously, the conductive fibers have an average length of from 1.6 to 25 mm, preferably from 4.0 to 13.0 mm. Correspondingly, the conductive fiber advantageously has a diameter of from 2.5 to 50 microns, preferably from 6.5 to 25.0 microns.

When a metallized fiber, such as metallized glass, graphite or plastic fiber, is used herein, the fiber contains a metal coating which advantageously covers a major portion of the cylindrical surface of the fiber. Preferably, the metal coating forms an essentially continuous coating on the surface of the fiber. Advantageously, the metal coating has a thickness from 0.1 to 125 microns, preferably from 0.1 to 76 microns thick.

When a metallized plastic fiber is employed, it is essential that the plastic portion of said metallized fiber be one with a significantly higher softening temperature than the resin which forms the continuous matrix of this composite so that the composite can be dried, molded, etc., above its softening temperature without melting the metallized fibers.

A wide variety of metals can be used as the coating of a metallized fiber. Generally, however, more highly conductive metals, as well as those of moderate price, are preferred. Thus, although precious metals such as silver, gold or platinum may be used herein, it is preferred, on the basis of cost, to employ less expensive metals such as, for example, nickel, aluminum, copper, steel or iron. A preferred metal coating is nickel or aluminum.

Commercially available metallized glass fibers include Metafil® G, from M. B. Associates, and RoMHOglas®, available from Lundy Electronics. A commercially available nickel-coated graphite fiber is Cycom®, available from American Cyanamid.

The conductive fibers are dispersed in the resin matrix such that they lie substantially in the plane defined by the composite sheet and are randomly oriented in two dimensions within said plane. The conductive fibers advantageously comprise from 0.25 to 45 percent by weight of the composite sheet of this invention. Preferably, the fibers comprise from 2 to 35 percent by weight, based on the weight of the composite sheet of this invention.

A third critical component of the resinous composite of this invention is a finely particulate conductive or semi-conductive filler material. This filler material is characterized as being of small particle size and non-fibrillar. Semi-conductive materials are well-known and are defined as those materials which are intermediate in conductivity or resistivity between conductors such as metals and non-conductors. Typically, semi-conductors have a resistivity of from $10^{-2}$ to $10^9$ ohms per centimeter. "Conductive" materials generally have a resistivity of less than $10^{-2}$ ohms per centimeter.

Exemplary semi-conductive filler materials include silicon, silicon dioxide, germanium, selenium, and carbon black. Of these, carbon black is preferred. Of particular interest are the so-called "conductive" carbon blacks which are finely particulate, highly porous, highly structured, very high surface area carbon blacks which have low volatile content (chemi-absorbed oxygen complexes) on the surface of the particles. Furnace blacks, as opposed to channel blacks, are preferred herein. Exemplary such conductive carbon blacks include Vulcan® XC-72, Vulcan®3C and Vulcan C, available from Cabot Corporation, and Ketjenblack®, available from Akzochemie. Most preferred are Ketjenblack and Black Pearls 2000®, manufactured by Cabot Corporation.

The electrically conductive carbon black as used herein generally has a specific surface area of from 20 to 1,800 m/g, as determined by the low temperature nitrogen absorption method (see ASTM D 3037-78) and the BET method, and a pore volume of from 1.5 to 4.0 ml/g as determined by the mercury pressure-introduction method (see *Powder Technology*, Vol. 29 (1), pp. 45–52, 1981) within the pore diameter of from 30 to 7,500 Å. In particular, carbon black having a specific surface area of from 200 to 1,200 m/g can be effectively used in the invention.

Suitable conductive particulate fillers include metallic flakes and powder, milled or ground metallized glass, graphite or plastic fibers, and the like. Combinations of the diverse particulate fillers may also be employed.

The particulate filler can be incorporated into the composite sheet of this invention in any convenient manner such as by milling or blending. If desired, a "concentrate" comprising a particulate polymer containing a somewhat higher amount of the conductive or semi-conductive filler, i.e., from 3 to 50 percent by weight, may be blended into the resin employed in preparing the composite sheet in an amount sufficient to provide the desired amount of particulate filler.

The conductive or semi-conductive particulate filler comprises from 0.05 to 30, preferably from 0.1 to 5 weight percent of the composite of this invention. The particulate filler material is dispersed as uniformly as possible throughout the resin matrix.

Various optional components are also advantageously employed in the composite of this invention. In the preferred method for making the composite sheet, it is generally necessary to employ a polymeric binder. Suitable binders include polymeric latexes of substantially water-insoluble organic polymers having bound anionic or cationic charges such as acrylic or styrene/butadiene polymers containing bound sulfonium, sulfoxonium, isothiouronium, pyridinium, quaternary ammonium, sulfate or sulfonate groups.

In addition, starch, particularly starch which contains linear polymers such as natural starch or corn starch, as well as enzymatically or chemically modified starch, and especially starch modified to contain bound cationic charges, are suitable as a binder in the preferred method and the resinous composite of this invention can contain said starch in the resin matrix. The binder generally comprises from 1 to 10 weight percent of the resinous composite. Latex binders which are suitable for use in said preferred method are described in greater detail in U.S. Pat. No. 4,426,470.

In addition, the preferred process generally requires the use of an organic flocculant. Accordingly, the composite of this invention prepared by said process generally further comprises the solids of suitable flocculants including organic or high molecular weight polymeric flocculants such as partially hydrolyzed polyacrylamide, modified cationic polyacrylamide, and diallydiethylammonium chloride. Such flocculant is typically present in relatively small amounts (i.e., less than about 5, preferably less than about 3 percent by weight of the composite of this invention).

The composite of this invention may also optionally contain minor amounts of a filler such as silicon dioxide, calcium carbonate, magnesium oxide, calcium silicate and mica. Pigments or dyes may also be added to impart opacity and/or color. Various chemical additives such as anti-oxidants, fire retardants, internal mold release agents, flow control agents, plasticizers, blowing agents, UV stabilizers, thickeners, foaming agents, anti-foaming agents, bacteriocide and the like may also be used for their art-recognized purposes.

In addition, non-conductive fibers may be incorporated into the resinous composite of this invention as a reinforcing agent. The use of such fibers to reinforce plastics is well known. Such non-conductive fibers may be in the form of short fibers or strands or, less preferably, in the form of rovings. Generally, the amount of non-conductive fibers is chosen such that the amount of fibers conductive and non-conductive does not exceed about 70, more preferably about 50 percent by weight of the composite of this invention. A preferred range for the non-conductive reinforcing fiber, in view of the foregoing limitations, is from 5 to 50 percent, based on the weight of the composite. Surprisingly, it has been found that the presence of non-conductive fibers also tends to increase the EMI shielding effectiveness of the composite sheet.

Suitable non-conductive fibers include, for example, glass fibers, polyester fibers, polybenzimide fibers, polybenzoxazol fibers, polybenzthiazole fibers, and the like.

The resinous composite of this invention is advantageously prepared in a paper-making process as described in U.S. Pat. Nos. 4,426,470; 4,550,131 and in European Patent Publication 81/00268. In such process, a dilute aqueous slurry of finely divided resin particles, conductive fibers, particulate semi-conductive or conductive filler material and binder (and optionally other fillers and non-conductive fibers) is prepared. This slurry is then flocculated with a flocculating agent and partially dewatered causing the flocculated solids to form into a sheet or web. The formed web can then be further dewatered and dried as by air drying at ambient conditions or oven drying. The web may then be densified by the application of heat and pressure to form a densified sheet which, advantageously, is from 0.051 to 2.54 mm (2 to 100 mil) thick. Advantageously, several of such sheets may be thermowelded together by the application of heat and pressure to form a thicker, stronger composite sheet. Preferably, a sufficient number of layers of the sheets are used so that the resulting composite sheet has a thickness of from 0.254 to 6.35 mm, preferably from 0.635 to 5.1 mm (10 to 250, preferably 25 to 200 mil).

Less preferred methods of incorporating the conductive fibers and particulate fillers into resins include the diverse known techniques. For example, one can, by use of a screw feeder or like equipment, combine the fibers into molten thermoplastic resins. However, such technique is generally unsuitable for friable fibers, such as metallized glass fibers, since the shearing conditions are too great for the fiber to withstand. However, such technique is suitable if less friable fibers, such as metal or metallized thermoplastic fibers are used, and care is taken to minimize shear during the mixing process.

If desired, the resinous composite of this invention can be chopped into segments of relatively small dimensions, of from ⅛ to 1 inch (3.2 to 25.4 mm) squares which can be used as a feed for an injection molding process. By operating said injection molding process under conditions of minimum shear, it is possible to prepare an injection molded composite within the scope of this invention. When the composite is injection molded, it is desirable to employ those fibers which are less friable, such as metal, graphite, metallized graphite or metallized plastic fibers.

When the composite sheet of this invention is used for EMI shielding, it advantageously exhibits an EMI shielding effectiveness of at least 20, preferably from 30 to 80 decibels or greater. Shielding efficiencies of from 30 to 60 decibels are adequate for a large majority of applications. Greater shielding effectiveness, of from 60 to 80 decibels or greater, are obtainable for special applications. The shielding effectiveness of the composite of this invention is quite surprising even at relatively low levels of conductive fibers and particulate fillers employed. By comparison, in commercially available conductive materials, it is generally necessary to use up to 40 percent by weight or more of conductive materials to achieve equivalent shielding characteristics of 40 decibels.

Emergency Standard Test Methods for Electromagnetic Shielding Effectiveness of Planar Materials are described in ASTM Designation ES 7-83.

The composite can be molded by any suitable technique into a desired shape for use. A significant advantage to this composite is its ability to be shaped into a part which performs structural as well as shielding functions. In particular, the composite sheet of this invention can be formed into complex shapes as may be required for use, for example, as an appliance cabinet or housing. In addition, the composite sheet of this invention is not especially susceptible to scratches, dents, mars, environmental weathering, surface oxidation and the like and therefore can be used as a protective covering as well as an EMI shield. Also, because of its strength, the composite of this invention can be used as a base or panel on which various components, e.g., electronic components, can be attached.

In general, the composite of this invention is placed between electronic parts to be protected. Preferably, the composite can be shaped to essentially completely enclose or be combined with other shielding materials to enclose electronic components to be protected.

The composite also has properties which render it useful in other applications. Because of the conductive fibers, the composite is capable of dissipating electrostatic charges. In the electronics industry, the instantaneous discharge of static electrical charges, or the build-up of such static charges itself can severely damage electronic components. The composite of this invention can be employed to dissipate such static electricity, thereby preventing instantaneous discharge or excessive static build-up. Often, the sheet is sufficiently conductive that it may be coated by electrodeposition, electrostatic spraying, or similar techniques.

In addition, the composite of the invention is also capable of absorbing microwaves and/or radio-frequency radiation, turning this energy into heat. This property allows the composite to be used, for example, as a browning dish for microwave cooking.

A further advantage of the composite of the invention is that, due to its ability to dissipate static electricity, it does not tend to electro-statically attract dust particles.

The following examples are provided to illustrate the invention but are not intended to limit the scope thereof. All parts and percentages are by weight unless otherwise indicated.

EXAMPLE 1

Composite Sample No. 1-A is prepared according to the following general procedure. Into a vessel containing 28 liters of thickened water (viscosity of about 2 centipoises) are dispersed 8.4 g of a polyethylene fibers (Tradename of Pulpex ® E made by Hercules Corp.), 46.2 g of aluminum coated glass fibers, 18 microns in diameter and ½ inch (12.7 mm) long (available from Lundy Electronics), and 46.2 g of 3/16 inch (4.76 mm) chopped strand glass fibers (415BB available from Owens Corning Fiberglass). The resulting slurry is stirred under high shear for about 5 minutes. Continuing the stirring, 166.4 g of a high density polyethylene powder (prepared generally according to the process of U.S. Pat. No. 4,323,531), 3 g of Ketjenblack ® conductive carbon black and 9.8 g (solids) of a 54/45/1 styrene/butadiene/fumaric acid latex are added. The mixture is then stirred for another 2 minutes. Then, 150 g of a 0.2 percent solid aqueous solution of Betz ® 1260 flocculant (available from Betz Laboratories) are added slowly to the stirred slurry. The slurry is then stirred for about 1 minute and 14 liters are poured into the headbox of a M/K sheet former (available from M/K Systems, Inc., Lynn, Mass.) 30 cm × 30 cm (12 inches × 12 inches) containing 14 liters of water. The slurry is mildly agitated and dewatered. The solids are collected on a 80 mesh (177 micron) screen, wet pressed and dried in a forced air oven at a temperature of 105° C. for 90 minutes. The sheet thus produced is pressed in a steam heated press at 4823 kPa (700 psi) and 165° C. to form a densified sheet. The sheet is then tested for shielding effectiveness using a shielded room enclosure and subjecting the sample sheet to a frequency of 1,000 MHz (1 GHz). This type of test facility is analogous to that described in ASTM-ES 7-83. The shielding effectiveness, in decibels (dB), for this composite is as reported in Table I following.

Example 1-B is prepared in a like manner, this time using 23.1 g of metallized glass and 69.3 g of non-metallized glass. This sheet is also evaluated for shielding effectiveness with the result as reported in Table I following.

For comparison, Comparative Sample Nos. C-1 to C-4 are prepared according to the foregoing general process. Sample No. C-1 contains no metallized glass fibers, 92.4 g of non-metallized glass fibers and no carbon black. Sample No. C-2 contains 23.1 g of metallized glass fibers, 69.3 g of non-metallized glass fibers and no carbon black. Sample No. C-3 contains 46.2 g of metallized glass fibers, 46.2 g of non-metallized glass fibers and no carbon black. Sample No. C-4 contains 3 g carbon black, no metallized glass fibers and 92.4 g of non-metallized glass fibers. These comparative samples are evaluated for shielding effectiveness with the result as indicated in Table I following.

TABLE I

| Sample No.[1] | Metallized Glass (weight percent) | Non-Metallized Glass Fibers (Weight Percent) | Carbon Black (Weight Percent) | Shielding Effectiveness (dB) |
|---|---|---|---|---|
| 1-A | 16.5 | 16.5 | 1.1 | 52 |
| 1-B | 8.25 | 24.75 | 1.1 | 44 |
| C-1* | 0 | 33 | 0 | 2 |
| C-2* | 8.25 | 24.75 | 0 | 26 |
| C-3* | 16.5 | 16.5 | 0 | 38 |
| C-4* | 0 | 33 | 1.1 | 8 |

*Not an example of this invention.
[1]All samples contain 166.4 g high density polyethylene, 9.8 g solids of a 54/45/1 styrene/butadiene/fumaric acid latex, and 0.3 g of active flocculant solids.

In evaluating shielding effectiveness of a composite sheet, an increase of 10 dB in shielding effectiveness corresponds to a 90 percent reduction in EMI. A 30 dB shield screens 99.9 percent of the EMI. A 50 dB shield screens 99.999 percent of the EMI, and so on. Stated another way, a 10 dB increase reduces or attenuates the stray EMI emissions from the device it encloses by an additional 90 percent.

In the foregoing example, Comparative Sample No. C-1 can be used as a base line. It is seen that the composite sheet without carbon black or metallized glass has a shielding effectiveness of 2 dB. By adding carbon black, as in Comparative Sample No. C-4, the shielding effectiveness is increased by 6 dB to a total of 8 dB. In Comparative Sample No. C-2, the presence of 8.25 weight percent of metallized glass fibers increases the shielding effectiveness to 26 dB. Comparing Sample No. C-2 with Sample 1-B, it is seen that the combined use of 8.25 weight percent of metallized glass fibers with 3 g of carbon black provides a synergistic increase in shielding effectiveness to 44 dB, which is 18 dB or 41 percent greater than that of Comparative Sample No. C-2. Only 6 dB of this difference can be accounted for by the addition of the carbon black into Sample No. 1-B. The remaining improvement is due to the unexpected interaction between the carbon black and conductive fibers in Sample No. 1-A. Thus, comparing Sample 1-B and Comparative Sample No. C-2, the surprisingly beneficial effect of employing the conductive fibers in conjunction with small amounts of carbon black is readily seen.

Similar observations are made in comparing Sample No. 1-A with Comparative Sample No. C-3. Both contain the same amount of metallized glass. However, Sample 1-A contains, in addition, 3 g of carbon black. The shielding effectiveness of Sample 1-A is 14 dB or 27 percent greater than that of Comparative Sample No. C-3. Here again, only 6 dB of this comparative analysis can be accounted for due to the presence of carbon black in Sample No. 1-A.

EXAMPLE 2

Using the general procedure and materials described in Example 1, composite Samples Nos. 2-A through 2-F are prepared. Sample 2-A through 2-E each contain 7.0 weight percent of metallized glass fibers and 26.0 weight percent of non-metallized glass fibers. In Sample 2-F, the loading of metallized glass fibers is increased to 8.25 weight percent and the loading of non-metallized glass fibers is reduced to 24.75 weight percent. The amount of carbon black (Vulcan ® XC-72) is varied in each sample, ranging from 0.1 to 2.1 weight percent, as is shown in Table II following. The resin used is Styron ® 6075, a commercially available polystyrene. Each of the samples are evaluated for shielding effectiveness with the results as reported in Table II following.

TABLE II

| Sample No.[1] | Metallized Glass Fibers (weight percent) | Non-Metallized Glass Fibers (weight percent) | Carbon Black (weight percent) | Shielding Effectiveness (dB) |
|---|---|---|---|---|
| 2-A | 7.0 | 26.0 | 0.1 | 24 |
| 2-B | 7.0 | 26.0 | 0.2 | 31 |
| 2-C | 7.0 | 26.0 | 0.3 | 35 |
| 2-D | 7.0 | 26.0 | 0.5 | 35 |
| 2-E | 7.0 | 26.0 | 2.1 | 38 |
| 2-F | 8.25 | 24.75 | 0.5 | 46 |

[1]All samples contain 169.4 g Styron ® 6075 polystyrene, 9.8 g solids of a 54/45/1 styrene/butadiene/fumaric acid latex and 0.3 g of active flocculant solids. Samples are molded at 4826 kPa and 190° C.

As can be seen from the results in Table II, very good EMI shielding is obtained using very low levels of both conductive fibers and carbon black. The shielding effectiveness is not particularly sensitive to the amount of carbon black since very low levels of carbon black are quite effective in providing desirable shielding effectiveness. A relatively small increase in the amount of conductive fibers by 1.25 weight percent, in combination with a small amount of carbon black, however, produces a 24 percent increase in shielding effectiveness when compared with Sample 2-D using the same amount of carbon black.

EXAMPLE 3

Using the general procedure described in Example 1, composite Samples 3-A through 3-D are prepared. Each sample is made of a polymer matrix containing 60.5 weight percent of polypropylene having a melt index of 35 g/10 min. as determined by ASTM 1238, 2.75 weight percent of nickel-coated graphite fibers, and 30.25 weight percent of non-metallized glass fibers having an average length of 12.7 mm. The results are recorded in Table III following.

TABLE III

| Sample No. | Non-Metallized Glass Fibers (weight percent) | Ni-Coated Graphite Fibers[1] (weight Percent) | Carbon Black[2] (weight Percent) | Shielding Effectiveness (dB) |
|---|---|---|---|---|
| 3-A | 30.25 | 2.75 | 0 | 32 |
| 3-B | 30.25 | 2.75 | 0 | 38 |
| 3-C | 30.25 | 2.75 | 4.0 | 52 |
| 3-D | 30.25 | 2.75 | 4.0 | 58 |

[1]Nickel-coated graphite fibers sold by American Cyanamid under the Tradename Cycom ®
[2]Black Pearls ® 2000 made by Cabot Corp.

Table III illustrates that the shielding effectiveness for a composite sheet employing nickel-coated graphite fibers in a substantially smaller amount of 2.75 weight percent is comparable to the higher loading of metallized glass fibers of Samples 2-A through 2-E even in the case of Examples 3-A and 3-B which employ no carbon black. A synergistic effect in shielding effectiveness can be seen when a small amount of carbon black is added, as in Samples 3-C and 3-D. A comparison of Samples 3-A and 3-C shows an increase in shielding effectiveness of 38 percent. A similar improvement in shielding effectiveness is realized when comparing Sample 3-D with Sample 3-B.

The difference in shielding effectiveness between Samples 3-A and 3-B and Samples 3-C and 3-D employing 4.0 weight percent carbon black is due to the fact that the nickel-coated graphite fibers of Samples 3-A and 3-C have an average length of 6.35 mm while the fibers of Samples 3-B and 3-D have an average length of 12.7 mm. The longer fibers show an improvement in shielding effectiveness over the shorter fibers in this example.

EXAMPLE 4

Using the general procedure and materials described in Example 1, composite Samples 4-A and 4-B are prepared. Each sample contains a varying amount of stainless steel fibers as shown in Table IV following.

TABLE IV

| Sample No.[1] | Stainless Steel Fibers[2] (weight percent) | Non-Metallized Glass Fibers (weight percent) | Carbon Black (weight percent) | Shielding Effectiveness (dB) |
|---|---|---|---|---|
| 4-A | 0.5 | 14.5 | 0.4 | 27 |
| 4-B | 1.0 | 14.5 | 0.4 | 33 |

[1]All samples contain 211.4 g Styron ® 6075 polystyrene, 9.8 g solids of a 54/45/1 percent mixture of styrene/butadiene/fumaric acid latex, 0.3 g flocculant solids, and 16.8 g polyethylene fibers (Pulpex ® E, made by Hercules Corp.). Samples are molded at 4826 kPa and 190° C.
[2]Manufactured by Brunswick Technetics of Deland, Florida having a length of 7.62 mm.

Table IV illustrates that a small amount of stainless steel fibers can be usefully employed in providing enhanced shielding when compared to Samples C-1 and C-4.

EXAMPLE 5

Using the general procedure and materials described in Example 1, composite Samples 5-A and 5-B are prepared as shown in Table V. Each sample contains a mixture of nickel-coated graphite fibers and graphite fibers having an average length of 6.35 mm. The graphite fibers of Sample 5-A contain 95 percent carbon, while the graphite fibers of Sample 5-B contain 99 percent carbon.

TABLE V

| Sample No.[1] | Ni-Coated Graphite Fibers[2] (weight percent) | Graphite Fibers[3] (weight percent) | Non-Metallized Glass Fibers (weight percent) | Carbon Black (weight percent) | Shielding Effectiveness (dB) |
|---|---|---|---|---|---|
| 5-A | 1.36 | 5.26 | 7.93 | 0.4 | 38 |
| 5-B | 1.36 | 5.26 | 7.93 | 0.4 | 48 |

[1]All samples contain 212.7 g Styron ® 6075 polystyrene, 9.8 g solids of a 54/45/1 styrene/butadiene/fumaric acid latex, 0.3 g flocculant solids, and 16.8 g polyethylene fibers (Pulpex ® E, made by Hercules Corp.). Samples are molded at 4826 kPa and 190° C.
[2]Manufactured by American Cyanamid under the Tradename of Cycom ®.
[3]Manufactured by Kureha.

The results recorded in Table V illustrate that a mixture of nickel-coated fibers and graphite fibers provide enhanced shielding effectiveness when compared to the shielding effectiveness of Samples C-1 and C-4. A slightly higher shielding effectiveness is obtained with Sample 5-B due to the use of a graphite fiber having a higher degree of graphitization.

EXAMPLE 6

Using the general procedure and materials described in Example 1, composite Samples 6-A to 6-E are prepared using as the polymer matrix a high density polyethylene (HDPE) having a melt index of 6.0 g/10 min. The example is similar to Example 3 and employs varying amounts of a nickel-coated graphite fiber having varying length, as shown in Table VI following. The nickel-coated graphite fibers are manufactured by American Cyanamid under the Tradename Cycon ®. Varying amounts of non-conductive glass fibers are added in Samples 6-A to 6-C. The glass fibers has an average length of 12.7 mm. A small amount of carbon black is added in Samples 6-A to 6-C. Samples 6-D and 6-E do not contain any non-conductive reinforcing fibers or carbon black. The results are as shown in Table VI following.

TABLE VI

| Sample No. | Ni-Coated Graphite Fibers (weight percent) Weight Percent | Ni-Coated Graphite Fibers (weight percent) Length | Non-Metallized Glass Fibers (weight percent) | Carbon Black (weight percent) | Shielding Effectiveness (dB) |
|---|---|---|---|---|---|
| 6-A | 2 | 6.35 mm | 31 | 0.4 | 44 |
| 6-B | 10 | 6.35 mm | 23 | 0.4 | 68 |
| 6-C | 20 | 6.35 mm | 13 | 0.4 | 72 |
| 6-D | 33 | 3.175 mm | 0 | 0 | 82 |
| 6-E | 33 | 12.7 mm | 0 | 0 | 78 |

Samples 6-A to 6-C illustrate that a higher loading of nickel-coated graphite fibers of a fixed length, i.e., average length of 6.35 mm, will provide higher shielding, although a gradual leveling out of shielding effectiveness at 10 to 20 weight percent is experienced with Samples 6-B and 6-C. Sample 6-D illustrates a very high shielding effectiveness with a very high loading of 33 weight percent nickel-coated graphite fibers having a length of ½ the length of the fibers of Samples 6-A to 6-C. Sample 6-D illustrates that a large increase in the number of conductive fibers is beneficial in obtaining high shielding effectiveness even in the absence of carbon black. A falling off in shielding effectiveness can be seen in Sample 6-E in which the number of fibers is reduced by a factor of 4 from Example 6-D. The data in Table VI illustrates that an optimization of the shielding effectiveness is readily obtainable by selecting the proper amount of fibers (in weight percent), the length of the fibers and a select amount of carbon black. The shielding and cost-effectiveness of Sample 6-C is extremely high and satisfactory for most commercial applications using a smaller weight percentage of nickel-coated fibers and carbon black as compared to Sample 6-D.

EXAMPLE 7

Using the general procedure and materials described in Example 1, composite Samples 7A to 7H are prepared using as the polymer matrix a high density polyethylene (HDPE) having a melt index of 6.0 g/10 min. All samples employ non-conductive glass reinforcing fibers having an average length of 4.76 mm. The loading of the fibers varies slightly from a minimum of 32.00 weight percent to a maximum of 32.75 weight percent. The samples include nickel-coated graphite fibers (manufactured by American Cyanamid under the Tradename Cycom®) having an average length of 6.35 mm. The conductive fiber loading varies from sample to sample. Samples 7-A to 7-D contains no carbon black, while Samples 7-E to 7-H contains 0.4 weight percent carbon black (Vulcan® XC-72 made by Cabot).

The samples were tested for surface and volume resistivity according to ASTM D-257 and Static Decay Rate (in seconds) in accordance with U.S. Federal Test Standard 101 C, Method 4046.1. The data is recorded in Table VII following.

TABLE VII

| Sample No. | Non-Metallized Glass Fibers (weight percent) | Ni-Coated Graphite Fibers (weight percent) | Carbon Black (weight percent) | Resistivity | | Static Decay (in sec.) | |
|---|---|---|---|---|---|---|---|
| | | | | Surface × (ohm/sq) | Volume × (ohm-cm) | +5 kv | −5 kv |
| 7-A | 32.75 | .25 | 0 | $7.71 \times 10^{13}$ | $1.47 \times 10^{15}$ | .04 | 1.47 |
| 7-B | 32.50 | .50 | 0 | $1.17 \times 10^{13}$ | $1.47 \times 10^{15}$ | .01 | .01 |
| 7-C | 32.25 | .75 | 0 | $2.78 \times 10^{4}$ | $8.49 \times 10^{7}$ | .01 | .01 |
| 7-D | 32.00 | 1.00 | 0 | $>1.00 \times 10^{3}$ | $1.81 \times 10^{7}$ | .01 | .01 |
| 7-E | 32.75 | .25 | .4 | $2.63 \times 10^{14}$ | $9.26 \times 10^{14}$ | .01 | .01 |
| 7-F | 32.50 | .50 | .4 | $2.63 \times 10^{5}$ | $6.17 \times 10^{14}$ | .73 | .01 |
| 7-G | 32.25 | .75 | .4 | $1.13 \times 10^{5}$ | $1.97 \times 10^{5}$ | .01 | .01 |
| 7-H | 32.00 | 1.00 | .4 | $1.58 \times 10^{5}$ | $3.47 \times 10^{6}$ | .01 | .01 |

The samples in Table VII illustrate that the addition of carbon black generally improves the surface and volume resistivity of the samples even though occasional aberrations in the measurements occur. A comparison between Sample 7-B (0 weight percent carbon black) and Sample 7-F shows an exponential drop of 8 units, i.e. from $1.17 \times 10^{13}$ to $2.63 \times 10^{5}$ and an exponential drop of 1 unit in volume resistivity with both samples employing only 0.5 weight percent nickel-coated graphite fibers. Exponential drops of 1 and 2 were observed in volume resistivity between Samples 7-A to 7-D and Samples 7-E to 7-H. An exponential drop of 1 being equal to a factor of 10 and an exponential drop of 2 being equal to a factor of 100.

What is claimed is:

1. A composite sheet comprising
   (a) a continuous matrix of a polymeric resin, having randomly dispersed therein;
   (b) from about 0.05 to about 30 weight percent of the composite of a fine particulate conductive or semiconductive filler material, and
   (c) from about 0.25 to about 45 weight percent of the composite of conductive fibers having an aspect ratio from 25 to 2000, a diameter of from 2.5 μm to 50 μm, and a length from 1.6 mm to 25 mm, said fibers being randomly oriented in two dimensions substantially in the plane defined by the sheet.

2. The composite sheet of claim 1 wherein said conductive fibers have an average length of from 4.0 to 13.0 mm and a diameter of from 6.5 to 25.0 micrometer.

3. The composite sheet of claim 1 wherein the aspect ratio of said conductive fibers is from 200 to 1,800.

4. The composite sheet of claim 1 wherein said composite sheet comprises from 2 to 35 percent conductive fibers and from 0.1 to 5 percent filler material, based on the weight of the composite.

5. The composite sheet of claim 4 wherein said filler material has a resistivity of from $10^{-2}$ to $10^{9}$ ohms-cm.

6. The composite sheet of claim 5 wherein said filler material is a furnace carbon black having a resistivity of less than 10 ohm/cm.

7. The composite sheet of claim 1 wherein said conductive fibers are selected from selected from the group consisting of stainless steel, nickel, carbon, graphite, metallized glass, metallized graphite or metallized plastic.

8. The composite sheet of claim 1 wherein said conductive fibers are nickel-coated graphite or aluminum-coated glass and said filler material is carbon black.

9. The composite sheet of claim 1, wherein said composite sheet includes from 25 to 50 percent by weight of non-conductive reinforcing fibers.

10. The composite sheet of claim 9, wherein said reinforcing fibers are glass fibers.

11. The composite sheet of claim 1 wherein said sheet has an EMI shielding effectiveness of greater than 20 to 80 decibels under conditions as specified by ASTM Designation ES 7-83.

12. The composite sheet of claim 1 wherein said sheet is capable of dissipating an electrostatic charge of +5 kv or −5 kv to 0 percent of total charge within 2 seconds.

13. The composite sheet of claim 12 wherein said sheet is capable of dissipating an electrostatic charge of +5 kv or −5 kv to 0 percent of total charge within 0.5 seconds.

* * * * *